(12) United States Patent
Lagerberg et al.

(10) Patent No.: US 8,922,231 B2
(45) Date of Patent: Dec. 30, 2014

(54) METHOD AND APPARATUS FOR INDEXING AN ADJUSTABLE TEST PROBE TIP

(75) Inventors: Chris W. Lagerberg, Seattle, WA (US); Roger Stark, Snohomish, WA (US)

(73) Assignee: Fluke Corporation, Everett, WA (US)

( * ) Notice: Subject to any disclaimer, the term of this patent is extended or adjusted under 35 U.S.C. 154(b) by 307 days.

(21) Appl. No.: 13/356,416

(22) Filed: Jan. 23, 2012

(65) Prior Publication Data

US 2012/0119771 A1    May 17, 2012

Related U.S. Application Data

(63) Continuation of application No. 12/333,096, filed on Dec. 11, 2008, now Pat. No. 8,154,316.

(51) Int. Cl.
G01R 31/20     (2006.01)
G01R 1/067     (2006.01)
G01R 1/02      (2006.01)

(52) U.S. Cl.
CPC ............ *G01R 1/06788* (2013.01); *G01R 1/025* (2013.01)
USPC ............ 324/754.03; 324/755.11; 324/755.03; 324/755.01

(58) Field of Classification Search
USPC ..................................... 324/755.03
See application file for complete search history.

(56) References Cited

U.S. PATENT DOCUMENTS

| | | | |
|---|---|---|---|
| 2,857,572 A | 10/1958 | Belart | |
| 2,957,156 A | 10/1960 | Gatto | |
| 3,196,217 A * | 7/1965 | Petrina | 200/4 |
| 3,315,163 A * | 4/1967 | Lutz | 324/149 |
| 3,363,221 A | 1/1968 | Stark | |
| 3,893,027 A * | 7/1975 | Veenendaal | 324/72.5 |
| 4,041,380 A * | 8/1977 | Epstein | 324/556 |
| 5,395,264 A | 3/1995 | Keith | |
| 5,414,346 A | 5/1995 | Mohan | |
| 5,691,635 A | 11/1997 | Pot | |
| 6,062,884 A | 5/2000 | Messimer | |
| 6,222,378 B1 * | 4/2001 | Campbell et al. | 324/755.05 |
| 6,384,614 B1 | 5/2002 | Hager | |
| 6,400,167 B1 | 6/2002 | Gessford | |
| 6,603,297 B1 | 8/2003 | Gessford | |
| 7,009,377 B2 | 3/2006 | Campbell | |
| 7,015,709 B2 * | 3/2006 | Capps et al. | 324/754.07 |
| 7,114,970 B2 | 10/2006 | Head | |
| 7,161,344 B2 | 1/2007 | Kwark | |
| 7,221,179 B1 | 5/2007 | Campbell | |
| 7,880,487 B2 | 2/2011 | Petrick | |
| 7,902,848 B2 | 3/2011 | Eccleston | |

OTHER PUBLICATIONS

Fluke Test Tools Catalog, vol. One 2007, pp. 1-72.

* cited by examiner

*Primary Examiner* — Richard Isla Rodas

(74) *Attorney, Agent, or Firm* — Christensen O'Connor Johnson Kindness PLLC

(57) ABSTRACT

Embodiments of the present invention are directed to adjustable test probe tips that are indexable. In one embodiment a mechanism is coupled to a probe tip so that the mechanism may be used to index the probe tip to a plurality of particular positions. A label portion may be provided to communicate to a user that the length of the exposed probe tip is less than a particular length, such as the maximum length an exposed probe tip may be for a particular application.

15 Claims, 5 Drawing Sheets

METHOD AND APPARATUS FOR INDEXING AN ADJUSTABLE TEST PROBE TIP

CROSS-REFERENCE TO RELATED APPLICATION

This application is a continuation of U.S. patent application Ser. No. 12/333,096, filed Dec. 11, 2008, the disclosure of which is hereby expressly incorporated by reference herein.

TECHNICAL FIELD

This invention relates generally to test instrument lead probes, and more specifically one or more embodiments relate to adjustable test probe tips.

BACKGROUND

Test instruments, such as multimeters, voltage meters, oscilloscopes and the like, are used to measure electrical parameters in various electrical devices. FIG. 1 illustrates an exemplary test instrument 100. The test instrument 100 has a test probe 102 that is coupled to an input/output 104 of the test instrument 100. The test probe 102 has a test lead 106 having a first end 108 that is coupled to the input/output 104 of the test instrument 100 and a second end 110 that is coupled to a probe body 112. The probe body 112 includes a tip 114, which is coupled to a test point (not shown) of a device (not shown) to be measured or tested. As will be clear to a person having ordinary skill in the art, a second test probe (not shown), such as a ground connector, may be coupled to input/output 105.

In general, different length test probe tips are used in various test applications. In the past, to accommodate the need for different length probe tips, various test probe assemblies having different probe tip lengths were used with test instruments. For instance, a user may have two sets of test probes, one probe set with long length probe tips and another set with short probe tips. Another method for accommodating for the need of different length probes has been to use probe tips that are removable from the probe holder or body. Thus, rather than replacing the entire probe assembly, only the probe tip needs to be replaced. However, both of these solutions require a user to have to manage two sets of test probes, either the entire test probe assembly or test probe tips. Often test points are located in an obstructed location and having multiple test probes or probe tips can result in problems for the user when switching out the different probes. For instance, the user may have difficulty carrying the extra probes or the equipment may put the user in an awkward position so that it is a challenge to change out the probes. Additionally, by having separate test probes, the user may misplace, drop, or lose the probes so that the appropriate probe or probe tip is not available when needed.

More recently, however, test probes have been designed with probe tips that are slideable within the probe holder or body. Thus, rather than replacing the entire probe assembly when a different length probe tip is required, the probe tip slides in and out of the probe body and is locked into position at a desired length. For instance, when a longer probe tip is required, a locking mechanism that holds the probe tip within the probe body may be released so that the probe tip is free to move within the probe body. A user may then slide the probe tip so that a greater portion of the probe tip is exposed from the probe body and lock the probe tip into position. Therefore, rather than replacing the probe assembly or the probe tip, a single probe tip may act as a varying length probe tip. When a long probe length is needed, the probe tip slides out of the probe body so that more of the probe tip extends from the probe body. When a short probe length is needed, some of the exposed probe tip slides back into the probe body so that less of the probe tip extends from the probe body. Consequently, a single probe tip provides versatility and a user does not need to carry around probes having varying lengths.

Recently, safety standards have been developed that limit the length of the exposed probe tip. In particular, the International Electrotechnical Commission (IEC), under the guidance of Technical Committee (TC66), generated a safety standard for Test and Measurement Equipment related to test probes referenced as IEC-61010-031. This standard specifies requirements for test probe tips for various test applications. For instance, the safety standard specifies the length of the exposed metal tip of the probe used in industrial applications, referred to as category III (CAT III) and category IV (CAT IV), installation must be less than 4 mm in length. The probe tip for low energy applications, such as used in household applications or category II (CAT II) installations, must be less than 18 mm in length. Having a probe tip with exposed metal 18 mm in length is important because this allows users to easily insert the probe tip into a standard wall socket for quick and accurate measurement, which is not possible with a 4 mm probe tip. For industrial applications (CAT III and CAT IV) where high energy exists, a reduced probe tip of 4 mm is important to help reduce risk of arcs and arc flash hazards, which is not an issue in CAT II environments.

Therefore, when using a slideable probe tip describe above, a user will not know whether the exposed length of the probe tip is within the specified length to meet the safety standard unless a measurement is made on the exposed length of the probe tip each time the probe tip length is adjusted. This requires a user to carry a measurement tool and results in a time consuming second step. Although a user may expose a portion of the probe tip that is significantly less than required by the safety standards discussed above and not have to make a measurement, most applications require the entire amount allowed under the safety standard. For instance, in household application, a user will need a probe tip to be very close to the 18 mm maximum length because it will allow the user to insert the probe tip into standard wall sockets.

There is, therefore, a need for a test probe having an adjustable length probe tip that indexes to predetermined lengths. Additionally, there is a need for an adjustable probe tip that communicates to a user the length of the exposed probe tip.

SUMMARY

The present invention is directed toward an apparatus and method for indexable adjusting test probe tips. In one aspect of the invention, a test probe includes a conductive member having a first end and a second end. An electrically conductive tip defines the second end, and an insulative member surrounds at least the first end of the conductive member so that a particular first length of the conductive member is exposed from the insulative member. A slide member is coupled to the conductive member to index the conductive member relative to the insulative member so that a particular second length of the conductive member is exposed from the insulative member.

In another aspect of the invention, a test probe includes an insulative member having an opening along its length and a conductive member having a first end and a second end, where an electrically conductive tip defines the second end. The first end of the conductive member is positioned in the opening in the insulative member. A slide member is coupled to the conductive member and is operable to move the conductive member from a first length being exposed from the opening of the insulative member to a second length of the conductive member being exposed from the opening of the insulative member, the second length being a specific distance from the first length.

In another aspect of the invention, a test probe includes a conductive member having a length with a first end and a second end, where an electrically conductive tip defines the second end of the conductive member. The test probe further includes an insulative member surrounding a first portion of the length of the conductive member and the first end of the conductive member so that a second portion of the length of the conductive member is exposed from the insulative member, where the conductive member is operable to move relative to the insulative member. The test probe further includes a locking mechanism that when locked, prevents the conductive member from moving relative to the insulative member. The test probe may include a label portion that corresponds to the length of the conductive member exposed from the insulative member.

DESCRIPTION OF THE DRAWINGS

The foregoing aspects and many of the attendant advantages of the present disclosure will become more readily appreciated by reference to the following detailed description, when taken in conjunction with the accompanying drawings, wherein.

DETAILED DESCRIPTION

Embodiments of the present invention are directed toward test probes used with test and measurement equipment, and more particularly, one or more embodiments relate to adjustable test probe tips that are indexable. In some embodiments, a probe tip is indexed using a mechanical system, an optical system, or a combination of thereof. Certain details are set forth below to provide a sufficient understanding of the embodiments of the invention. However, it will be clear to one skilled in the art that various embodiments of the invention may be practiced without these particular details.

Figure 1:
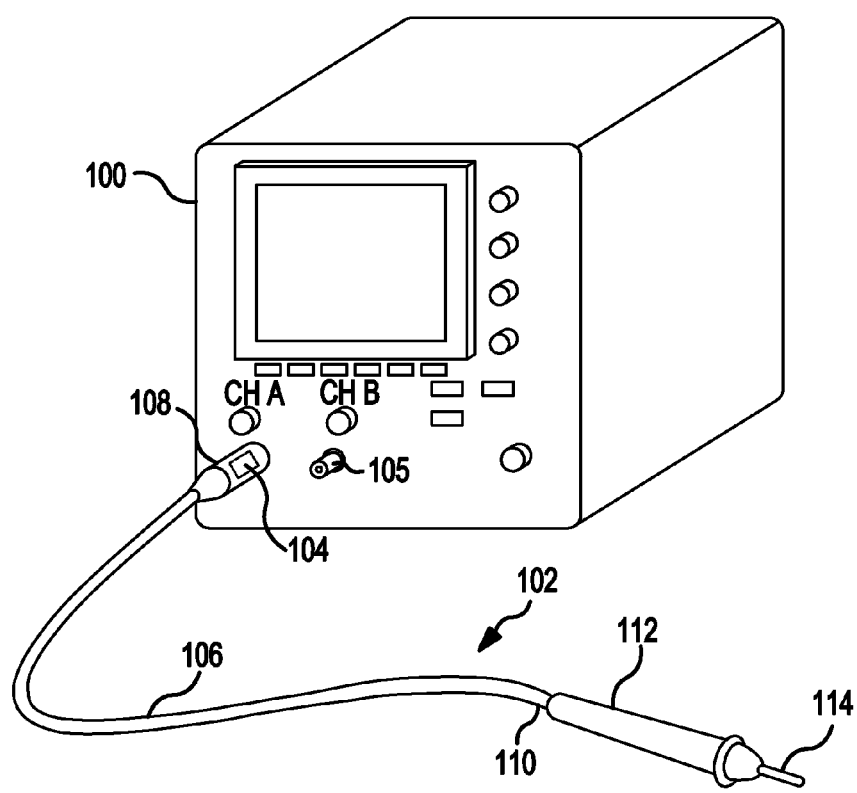
FIG. 1 is a schematic drawing of a test instrument in accordance with prior art.
Figure 2A:
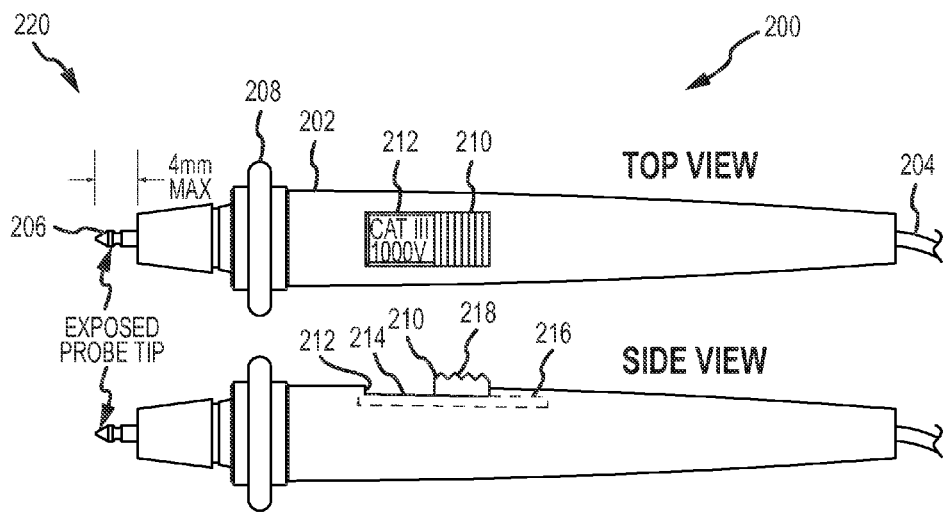
FIG. 2A is a top and a side view of a schematic drawing of a test probe according to one embodiment of the invention.
Figure 2B:
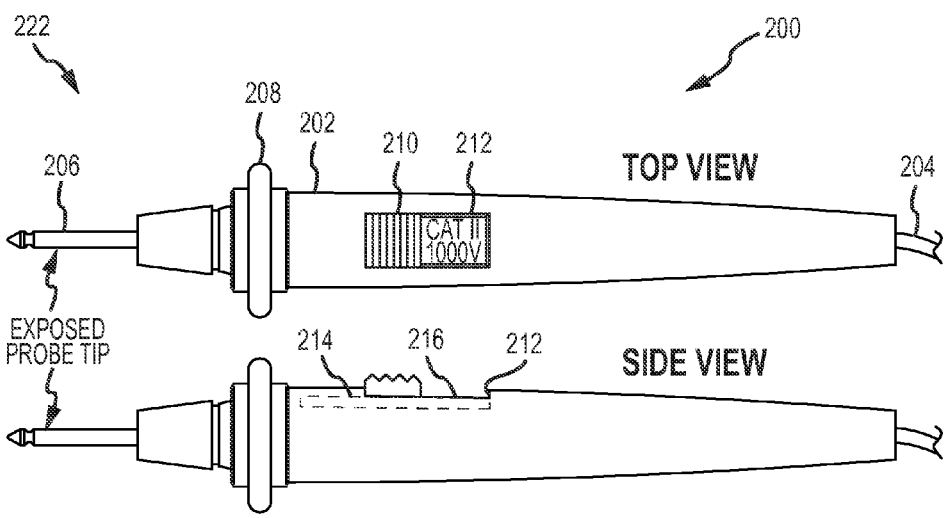
FIG. 2B is a top view and a side view of a schematic drawing of a test probe according to one embodiment of the invention.

FIGS. 2A and 2B illustrates a respective top view and a side view of a test probe 200 according to one embodiment of the invention. The test probe 200 includes a probe body 202, a test lead 204, and a probe tip 206. The probe body 202 is made from an insulative material. The probe tip 206 is made from an electrically conductive material, and is configured to be placed in electrical communication with a test point (not shown) of a test device (not shown). As discussed above, the test lead 204 is configured to be coupled to the input/output of a test instrument (not shown).

The probe tip 206 is moveable within the probe body 202. Additionally, the probe tip 206 is indexable. That is, the probe tip 206 may be indexed to a plurality of positions where each position defines the length of the exposed probe tip 206. In the embodiment shown in FIG. 2A and 2B, the probe tip 206 is indexed to two positions. A first position 220 is shown in FIG. 2A and a second position 222 is shown in FIG. 2B. A slide button 210 is provided within the probe body 202 for moving and indexing the probe tip 206. The slide button 210 is coupled to the probe tip 206 within the probe body 202 so that when a user moves the slide button 210 the probe tip 206 also moves. For instance, in one embodiment, as the slide button 210 is moved towards the probe tip 206, the length of the probe tip 206 exposed from the probe body 202 increases.

Figure 2C:
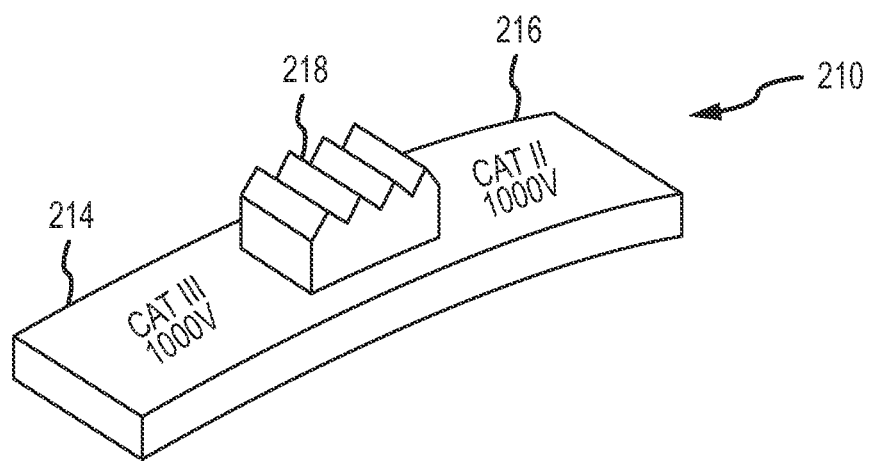
FIG. 2C is a schematic drawing of the slide button according to one embodiment of the invention.

FIG. 2C shows one embodiment of the slide button 210 disclosed in FIGS. 2A and 2B. The slide button 210 includes a first label portion 214, a second label portion 216, and a lever portion 218. The first and second label portions 214 and 216 communicate to the user the length of the exposed part of the probe tip 206. In the embodiment shown, the first and second label portions 214 and 216 are a visual element that describes the category installation rating to indicate that the length of the exposed part of the probe tip 206 is less than the specified length for that particular category. FIGS. 2A and 2B show some of the detailed features of the slide button 210 discussed above. For instance, in FIG. 2A the first label portion 214 is positioned in the opening 212 to communicate that the probe tip 206 is indexed so that the length of the exposed probe tip 206 is less than the required length for a category III rating. Additionally, in FIG. 2B the second label portion 216 is positioned in the opening 212 to communicate that the probe tip 206 is indexed so that the length of the exposed probe tip 206 is less than the required length for a category II rating. As can be seen in FIG. 2B, when the second label portion 216 is positioned in the opening 212, the first label portion 214 is not positioned in the opening 212. As will be clear to a person having ordinary skill in the art, the first and second label portions 214 and 216 may provide any type of communication to a user, such as physical markings that can be detected by touch or visual markings, which communicates the length of the probe tip 206 that is exposed from the probe body 202.

As discussed above, in the embodiment shown in FIG. 2A the probe tip 206 is indexed in a first position 220. In particular, the lever portion 218 of the slide button 210 is positioned adjacent a side of the probe body 202 that is coupled to the lead wire 204. The probe body 202 includes an opening 212 in the probe body 202 to expose the first and second label portions 214 and 216 of the slide button 210 to a user. For instance, while the probe tip 206 is indexed in the first position 220, the first label portion 214 of the slide button 210 is exposed to a first side of the opening 212 so that a user may determine from the first label portion 214 the length of the exposed part of the probe tip 206 or the category rating for which the probe tip 206 may be used. When the lever portion 218 of the slide button 210 is moved to a second position shown in FIG. 2B, the exposed part of the probe tip 206 is indexed to a second position 222. The second label portion 216 of the slide button 210 is exposed to a second side of the opening 212. Therefore, the second label portion 216 correlates to the indexed second position 222 of the probe tip 206 and the first label portion 214 correlates to the indexed first position 220.

In the embodiment shown in FIG. 2A and 2B, the test probe 200 includes a finger guard 208 to prevent a user's hand from slipping into the exposed probe tip 206 when the probe tip 206 is being used. However, as will be clear to a person having ordinary skill in the art, the finger guard 208 may not be used in some embodiments.

Figure 3A:
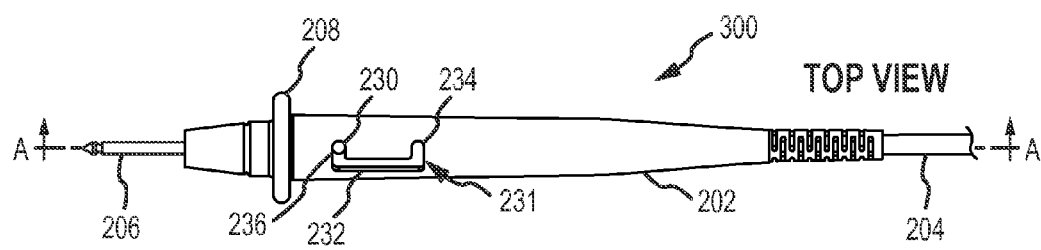
FIG. 3A is a top view of a schematic drawing of a test probe according to one embodiment of the invention.
Figure 3B:
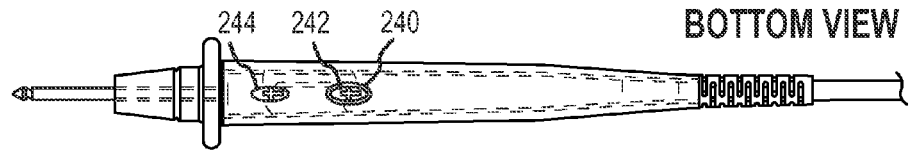
FIG. 3B is a bottom view of a schematic drawing of the test probe in FIG. 3A.
Figure 3C:
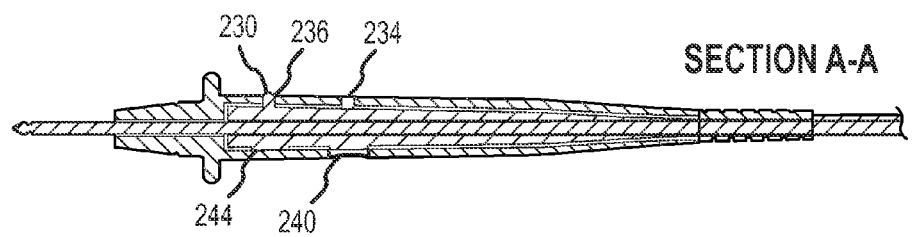
FIG. 3C is a cross sectional schematic drawing of the test probe in FIG. 3A.

FIGS. 3A-3C illustrate various views of a test probe 300 having an indexable probe tip 206 according to another embodiment of the invention. FIG. 3A is a top view of the test probe 300, FIG. 3B is a bottom view of the test probe 300, and FIG. 3C is a cross sectional view of the test probe 300 along the line A-A in FIG. 3A. Most of the components of the test probe 200 in FIGS. 2A-2B are used in the test probe 300 in FIGS. 3A-3C. Therefore, in the interest of brevity, an explanation of their structure and function will not be repeated. The test probe 300 differs from the test probe 200 by the mechanism used to index the test probe tip 206. The test probe tip 206 is indexed by moving slide lever 230 along an opening 231 in the probe body 202. The probe body 202 opening 231 includes a main channel 232 and two slots 234 and 236. The main channel 232 may be provided along a portion of the length of the probe body 202. As a user moves the slide lever 230 along the main channel 232, the probe tip 206 moves relative to the probe body 202. The slider lever 230 may be rotationally biased towards slots 234 and 236 in the opening 231 of the probe body 202. Alternatively, a user may slide the slide lever 230 into the slots 234 and 236. In some embodiments, the slider lever 230 is locked into each slot 234 and 236. Therefore, the slide lever 230 in combination with the opening 231 in the probe body 202, provides mechanical indexing of the probe tip 206.

FIG. 3B illustrates a bottom view of the test probe 300. The bottom of the test probe 300 includes an opening 240 that exposes a first label portion 242 to the user that provides an optical element to confirm the indexed position of the probe tip 206. When the probe tip 206 is indexed to a second position by moving the slide lever 230 into the slot 234, the second label portion 244 is exposed through the opening 240 in the probe body 202. In another embodiment, a label (not shown) is provided in 236 when the slide lever is positioned in slot 236. For instance, the slot 234 would indicate the length of the exposed probe tip 202 when the slider lever 230 is positioned in the slot 236. Conversely, the slot 236 would indicate the length of the exposed probe tip 206 when the slide lever 230 is located in the slot 234.

FIG. 3C shows the slide lever 230 positioned in slot 236 of opening 231. When the slide lever 230 is positioned in the slot 236, the exposed length of the probe tip 206 from the probe body 202 is the length shown in FIGS. 3A-3C. However, if the slide lever 230 were positioned into slot 234, the length of the probe tip 206 exposed from the probe body 202 would be less than the length shown in FIGS. 3A-3C. When the slide lever 230 is positioned into slot 234, the second label portion is exposed through the opening 240 in the probe body 202.

Figure 4A:
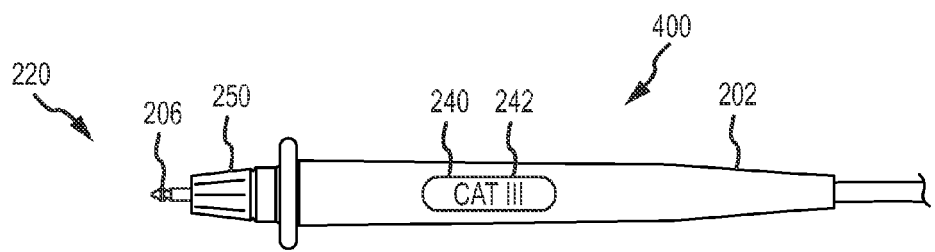
FIG. 4A is a schematic drawing of a test probe according to one embodiment of the invention.
Figure 4B:
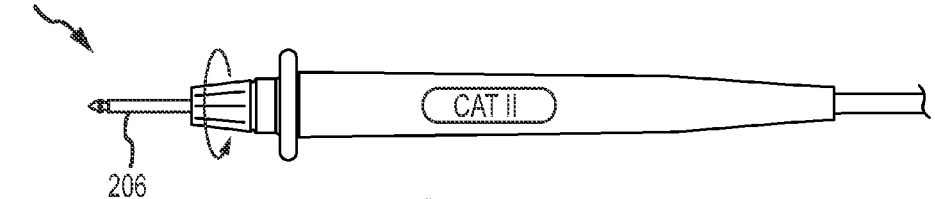
FIG. 4B is a schematic drawing of a test probe according to one embodiment of the invention.

FIGS. 4A and 4B illustrate a test probe 400 having an indexable probe tip 206 according to another embodiment of the invention. Most of the components of the test probe 200 in FIGS. 2A-2B are used in the test probe 400 in FIGS. 4A-4B. Therefore, in the interest of brevity, an explanation of their structure and function will not be repeated. FIG. 4A shows the test probe tip 206 indexed in a first position 220, and FIG. 4B shows the test probe tip 206 indexed to a second position 222. The probe tip 206 is moved by manually sliding the probe tip 206 within the probe body 202. In this embodiment, the probe tip 206 is indexed optically via a label 242 positioned in an opening or window 240 provided in the probe body 202. For instance, in FIG. 4A the probe tip is indexed to a first position 220 when a first label portion indicating a category III is located in the opening 240 of the probe body 202. The length of the probe tip 206 extending from the probe body 202 is, therefore, within the limit defined by a category III rating. In FIG. 4B, however, the probe tip 206 is indexed to a second position 222, a category II rating, as indicated by a second label portion positioned at the opening 240 in the probe body 202. Therefore, the length of the probe tip 206 extending from the probe body 202 is within the limits defined by the category II rating.

As stated above, the probe tip 206 slides into and out of the probe body 202. A front locking cap 250 is provided to lock the probe tip 206 into position after the probe tip 206 has been indexed to its desired location. In the embodiment provided in FIGS. 4A-4B, the front locking cap 250 is locked or unlocked by rotating the front locking cap 250 relative to the probe body 202. In this embodiment, the front locking cap 250 has threads that mate with threads on the probe body 202. However, as will be clear to a person having ordinary skill in the art, the front locking cap 250 may use any means for locking the probe tip 206 into position. Once a user has optically determined that the probe tip 206 has been properly indexed, such as by centering the category rating in the opening of the probe body 202, the user may rotate the front locking cap 250 to lock the probe tip 206 into position.

Figure 5A:
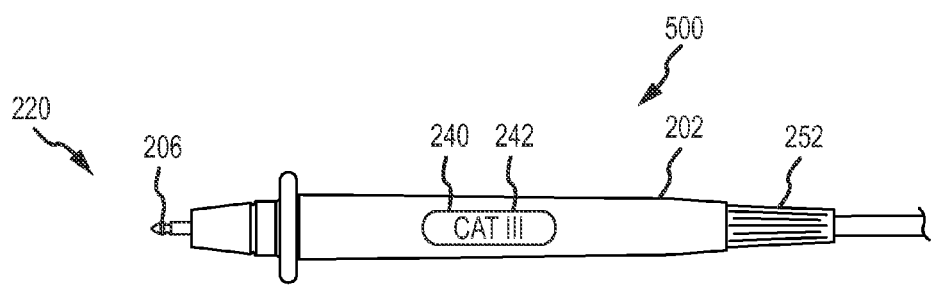
FIG. 5A is a schematic drawing of a test probe according to one embodiment of the invention.
Figure 5B:
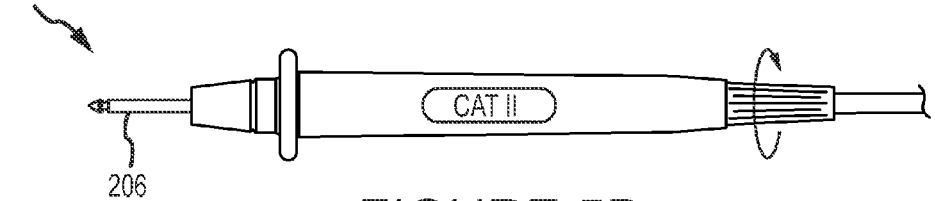
FIG. 5B is a schematic drawing of a test probe according to one embodiment of the invention

FIGS. 5A-5B illustrate a test probe 500 having an indexable probe tip according to another embodiment of the invention. FIG. 5A shows the test probe tip 206 indexed in a first position 220, and FIG. 5B shows the test probe tip 206 indexed to a second position 222. Most of the components of the test probe 400 in FIGS. 4A-4B are used in the test probe 500 in FIGS. 5A-5B. Therefore, in the interest of brevity, an explanation of their structure and function will not be repeated. The test probes in FIGS. 5A-5B differ from the test probes in FIGS. 4A-4B by having a back locking cap 252 in test probe 500, rather than a front locking cap 250 in test probe 400. The back locking cap 252 provides a similar function as the front locking cap 250 in that it is operable to lock the probe tip 206 into a position. In particular, after the probe tip 206 is indexed to a particular position, the back locking cap 252 may be rotated or snapped into position to lock the probe tip 206 into the indexed position. As in the test probe 400 shown in FIGS. 4A-4B, the test probe 500 in FIGS. 5A-5B is indexed optically via an opening 240 in the probe body 202.

Although the present invention has been described with reference to the disclosed embodiments, persons skilled in the art will recognize that changes may be made in form and detail without departing from the spirit and scope of the invention. For instance, the test probe tip may be indexable to a plurality of positions. Additionally, the probe tip may be fully retractable within the probe body. The test probe tip may be indexed optically, mechanically, or a combination thereof. Additionally, any means of communication may be used to communicate to a user the that the probe tip the position in which the probe tip has been indexed, such as visual element, audio element, or a raised surface on a label portion that a user can feel to determine the length of the exposed probe tip or the category rating. Additionally, any method of locking the probe tip into position may be used. Such modifications are well within the skill of those ordinarily skilled in the art. Accordingly, the invention is not limited except as by the appended claims.

The embodiments of the invention in which an exclusive property or privilege is claimed are defined as follows:

1. A test probe, comprising:
   (a) a conductive member having an electrically conductive tip and further having a first end of the conductive member opposite of the tip;
   (b) an insulative member having an insulative member axis extending along a length of the insulative member, the insulative member surrounding a first portion of the conductive member and the first end of the conductive member so that a second portion of the conductive member is exposed from the insulative member, the conductive member being operable to move relative to the insulative member substantially along the insulative member axis in first and second directions; and
   (c) a locking mechanism that is rotatably coupled to the insulative member and rotatable relative to the insulative member in the first direction while coupled to the insulative member to prevent the conductive member from moving relative to the insulative member substantially along the insulative member axis in the first and second directions and wherein the locking mechanism is rotatable relative to the insulative member in the second direction while coupled to the insulative member to allow the conductive member to move relative to the insulative member substantially along the insulative member axis in the first and second directions.

2. The test probe of claim 1, further comprising a label portion that corresponds to a length of the conductive member exposed from the insulative member, the label portion provided through an opening in the insulative member.

3. The test probe of claim 2, wherein the label portion corresponds to the length of the conductive member being exposed from the insulative member by indicating a category rating for the exposed length.

4. The test probe of claim 1, wherein the locking mechanism is positioned at a first end of the insulative member so that the locking mechanism provides pressure to the first portion of the conductive member.

5. The test probe of claim 1, wherein the locking mechanism is positioned near the first end of the conductive member.

6. The test probe of claim 1, wherein the locking mechanism is a cap that is threaded onto an end of the insulative member.

7. A method for adjusting a length of a conductive member having a probe tip exposed from a first end of an insulative member having an insulative member axis extending along a length of the insulative member, wherein the conductive member is operable to move relative to the insulative member substantially along the insulative member axis in first and second directions, the method comprising:
   (a) rotating a locking mechanism relative to the insulative member while coupled to the insulative member into a first position to allow the conductive member to move relative to the insulative member substantially along the insulative member axis in the first and second directions;
   (b) moving the conductive member to expose a first length of the probe tip from the first end of the insulative member; and
   (c) rotating the locking mechanism relative to the insulative member while coupled to the insulative member into a second position to prevent the conductive member from moving relative to the insulative member substantially along the insulative member axis in the first and second directions.

8. The method of claim 7, wherein a label portion indicating the first length of the probe tip exposed from the insulative member is exposed through an opening in the insulative member when the first length of the probe tip is exposed from the first end of the insulative member.

9. The method of claim 7, wherein a label portion indicating a category rating for the first length of the probe tip exposed from the insulative member is exposed through an opening in the insulative member when the first length of the probe tip is exposed from the first end of the insulative member.

10. The method of claim 7, further comprising:
    (a) rotating the locking mechanism relative to the insulative member while coupled to the insulative member into the first position to allow the conductive member to move relative to the insulative member substantially along the insulative member axis in the first and second directions;
    (b) moving the conductive member to expose a second length of the probe tip from the first end of the insulative member; and
    (c) rotating the locking mechanism relative to the insulative member while coupled to the insulative member into the second position to prevent the conductive member from moving relative to the insulative member substantially along the insulative member axis in the first and second directions.

11. A test probe, comprising:
    (a) a conductive member having an electrically conductive tip and further having a first end of the conductive member opposite of the tip;
    (b) an insulative member surrounding a first portion of the conductive member and the first end of the conductive member so that a second portion of the conductive member is exposed from the insulative member, the conductive member being operable to move relative to the insulative member;
    (c) a locking mechanism that is rotatable relative to the conductive member in a first direction to prevent the conductive member from moving relative to the insulative member and rotatable relative to the conductive member in a second direction to allow the conductive member to move relative to the insulative member; and
    (d) a label portion that corresponds to a length of the conductive member exposed from the insulative member by indicating a category rating for the exposed length, the label portion provided through an opening in the insulative member.

12. The test probe of claim 11, wherein the locking mechanism is positioned at a first end of the insulative member so that the locking mechanism provides pressure to the first portion of the conductive member.

13. The test probe of claim 11, wherein the locking mechanism is positioned near the first end of the conductive member.

14. The test probe of claim 11, wherein the locking mechanism is rotatable relative to the insulative member.

15. The test probe of claim 11, wherein the locking mechanism is a cap that is threaded onto an end of the insulative member.

* * * * *